Figure 1:
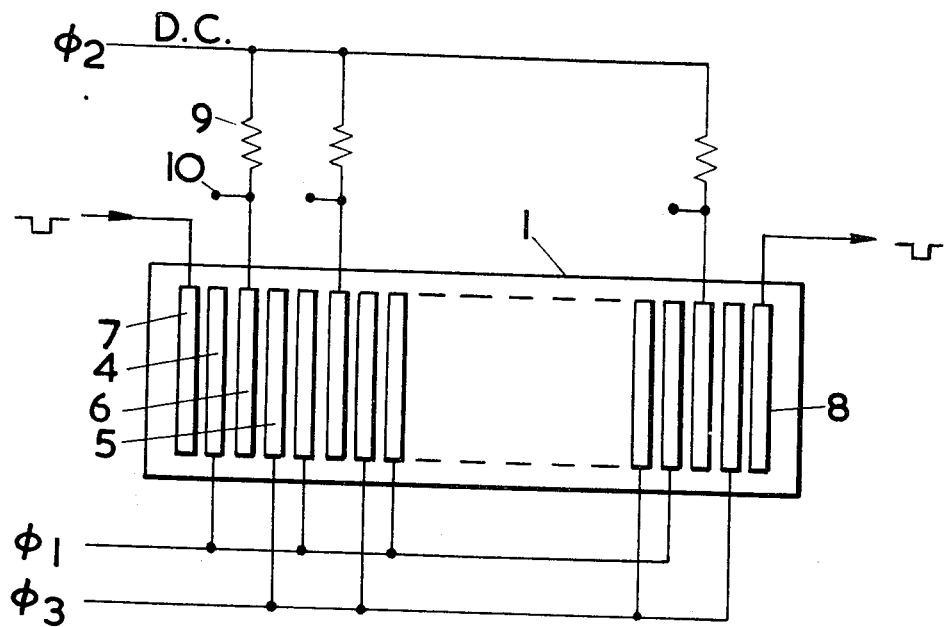

United States Patent [19]
McLennan et al.

[11] 3,950,655
[45] Apr. 13, 1976

[54] CHARGE COUPLED DEVICE WITH PLURAL TAPS INTERPOSED BETWEEN PHASED CLOCK

[75] Inventors: Donald John McLennan, Bonnyrigg; John Mavor, Edinburgh, both of Scotland; Gary Francis Vanstone, Malvern; Donald James Windle, Upton-on-Severn, both of England

[73] Assignee: British Secretary of State for Defence, London, England

[22] Filed: Nov. 12, 1974

[21] Appl. No.: 523,082

[30] Foreign Application Priority Data
Nov. 13, 1973  United Kingdom............. 52709/73

[52] U.S. Cl............................ 307/221 D; 357/24
[51] Int. Cl.²......................................... G11C 19/28
[58] Field of Search........ 307/221 C, 221 D, 223 C; 357/24

[56] References Cited
UNITED STATES PATENTS

| | | |
|---|---|---|
| 3,252,009 | 5/1966 | Weimer............................ 307/223 C |
| 3,660,697 | 5/1972 | Berglund et al................. 307/221 C |
| 3,700,932 | 10/1972 | Kahng............................. 307/221 C |
| 3,745,383 | 7/1973 | Sangster.......................... 307/221 C |
| 3,746,883 | 7/1973 | Kovac.............................. 307/221 D |
| 3,760,202 | 9/1973 | Kosonocky .......................... 307/304 |
| 3,819,958 | 6/1974 | Gosney............................ 307/221 D |
| 3,852,801 | 12/1974 | Itoh et al. ......................... 307/221 D |
| 3,858,232 | 12/1974 | Boyle et al........................... 357/24 |
| 3,877,056 | 4/1975 | Bailey.............................. 307/221 D |
| 3,890,633 | 6/1975 | Kosonocky ........................... 357/24 |

*Primary Examiner*—John S. Heyman
*Attorney, Agent, or Firm*—Elliott I. Pollock

[57] ABSTRACT

A charge coupled device in which a row of electrodes is deposited over an insulating layer on a substrate has clocking pulses applied to some electrodes for clocking charge packets from source to drain gates and a steady or long pulses applied to other, tapping, electrodes. Amplifying circuitry connected to each tapping electrodes non-destructively measures the change in capacitance under the tapping electrode as a charge packet passes under it.

7 Claims, 8 Drawing Figures

CHARGE COUPLED DEVICE WITH PLURAL TAPS INTERPOSED BETWEEN PHASED CLOCK

This invention relates to charge coupled devices (CCD) and provides a tapping arrangement whereby a charge passing along the device may be sensed.

The basic concept of a charge coupled device is well documented; in essence a charge coupled device comprises a semiconductor substrate with a flat surface on which an insulating oxide layer is grown. A source gate is arranged at one end and a drain gate is arranged at the other end of the oxide layer to inject electrons or holes into and collect electrons or holes from the substrate. A row of parallel fingers electrodes is spaced along the oxide layer, between the source and drain, and supplied in a sequence with voltage pulses. These pulses cause depletion wells to grow and collapse as pulses are applied and removed from electrodes. Packets of charge from the source gate flow into one well as it grows, and when that well collapses, into an adjacent growing well. Thus packets of charge are clocked along a CCD in synchronism with pulses on the electrodes.

Charge coupled devices are useful as delay lines in which the total delay equals the number of electrodes multiplied by the pulse period.

For some applications it is necessary to sense when and what value of charge is passing a particular part of the substrate without destruction of the charge.

According to this invention a charged coupled device includes a substrate, an insulating layer on a surface of the substrate, a row of electrodes spaced apart parallel to one another on the insulating layer and including clocking electrodes and at least one tapping electrode, a source gate at one end of the row of electrodes and a drain gate at the other end of the row of electrodes, means for applying short clocking voltage pulses to the clocking electrodes, means for applying either a steady voltage or voltage pulses long in comparison with the clocking pulses to the tapping electrode whereby depletion wells may be formed in the substrate under the electrodes, and means for sensing the quantity of charge in a depletion well under a tapping electrode when a packet of charge is transferred from the source gate to the drain gate in the depletion wells.

The means for sensing the charge may include field effect transistors such as metal oxide semiconductors (MOS) amplifying circuitry formed on the CCD.

The means for applying a voltage to the tapping electrode should include circuitry arranged to maintain the voltage applied to the tapping electrode substantially constant during the time a charge is being sensed.

Figure 2:
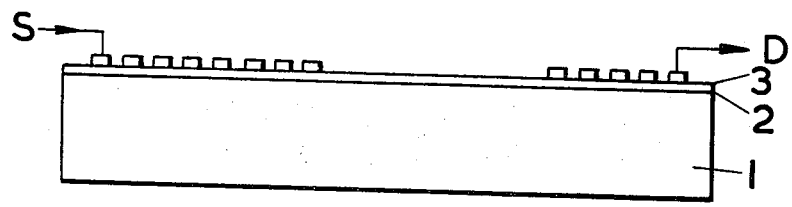
Figure 6:
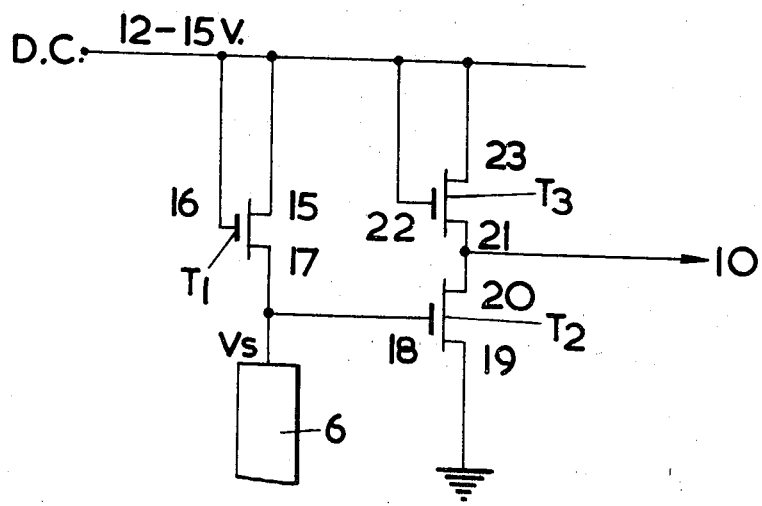
Figure 3:
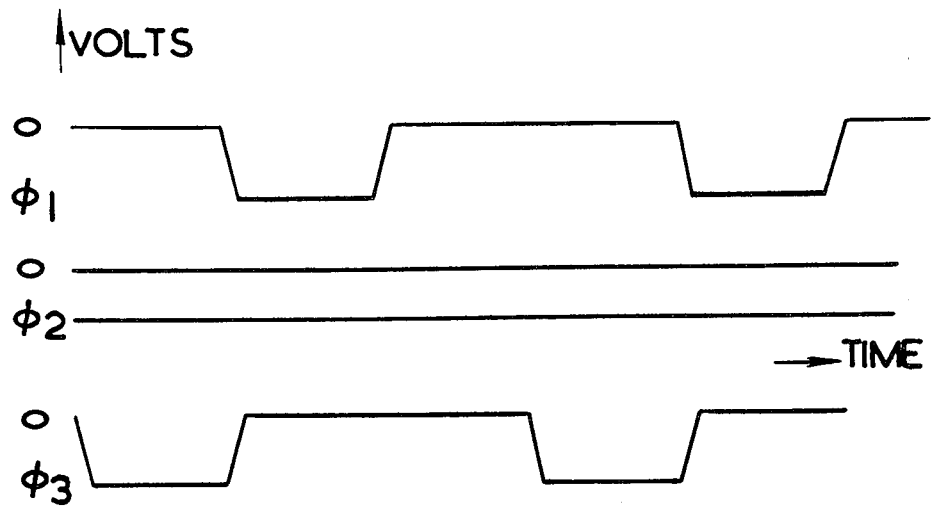
Figure 5:
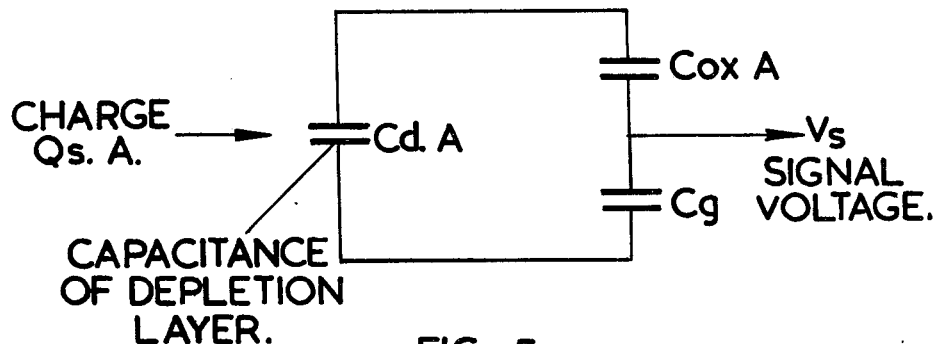
Figure 4:
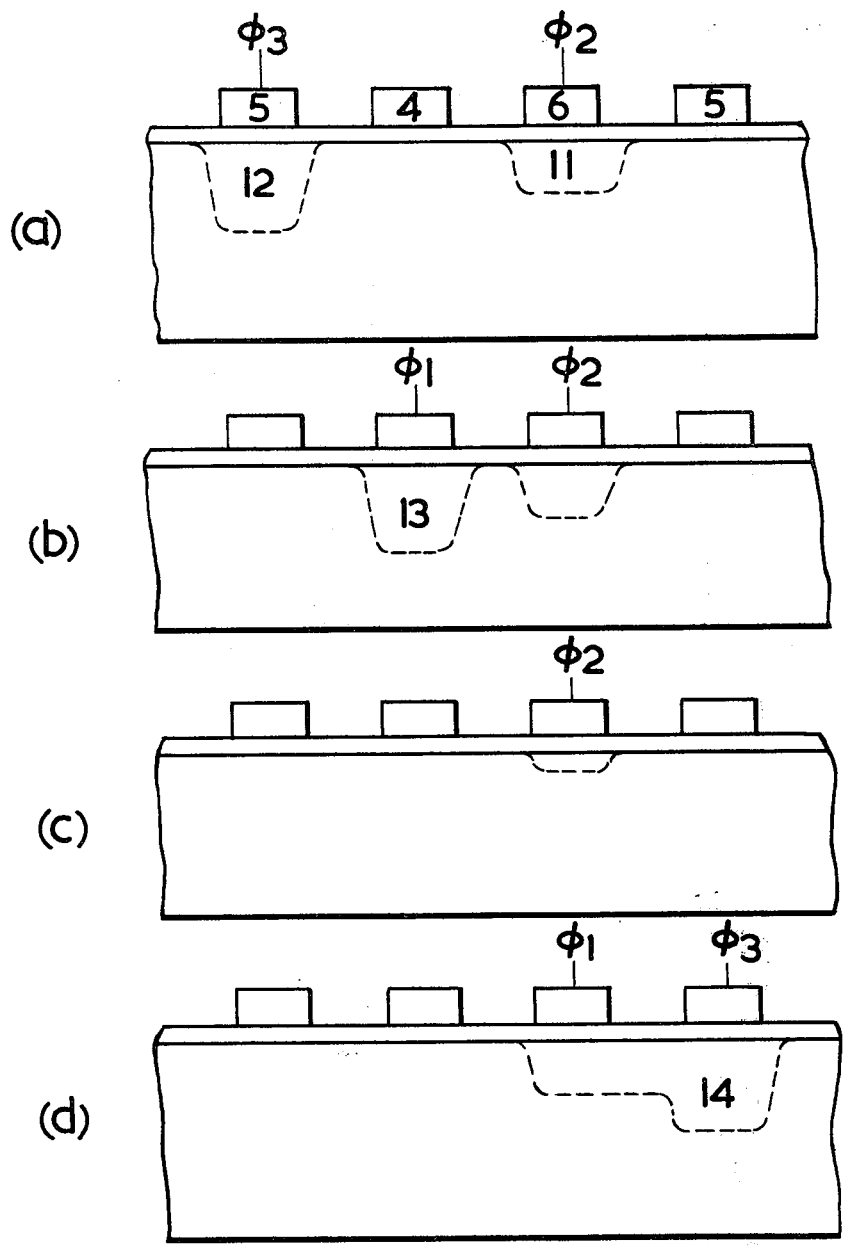
Figure 7:
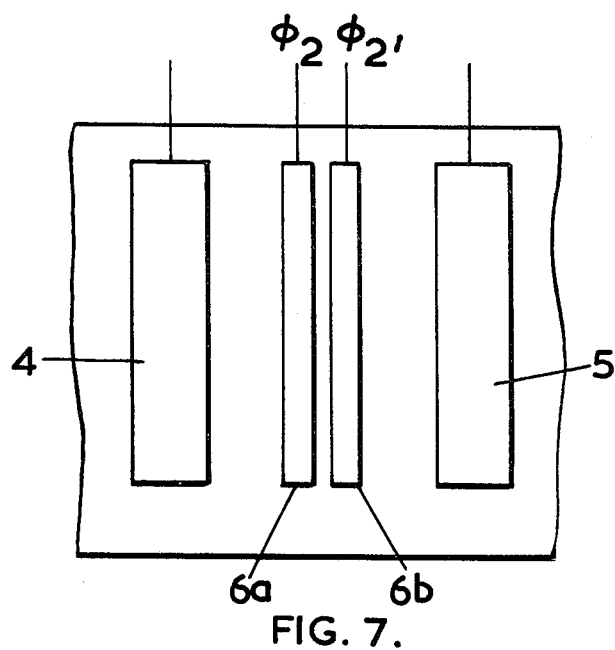
Figure 8:
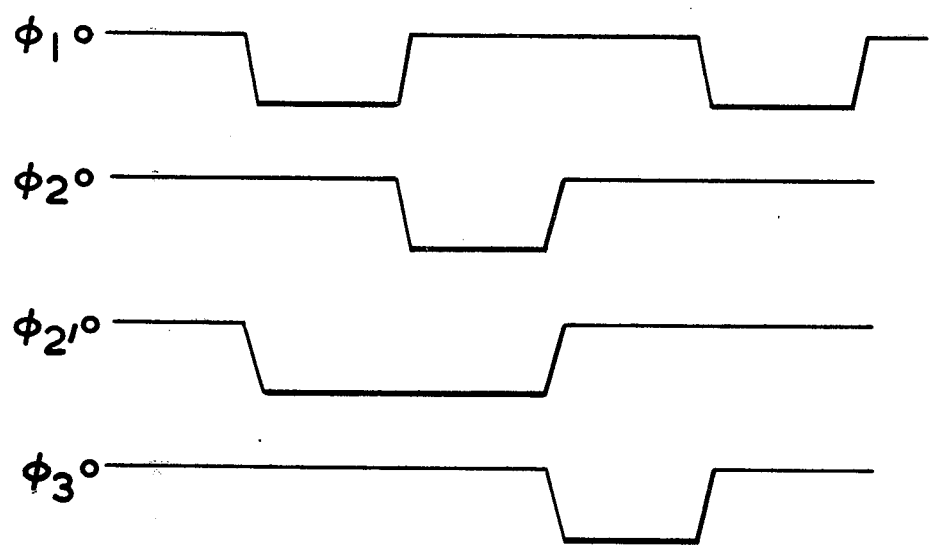

The invention will now be described by way of example only with reference to the accompanying drawings of which:

FIG. 1 is a plan view of charge coupled device;
FIG. 2 is a side view of the device of FIG. 1;
FIG. 3 is a plot of voltage against time for voltage applied to the device of FIG. 1;
FIG. 4 is a diagrammatic side view showing movement of depletion wells in a substrate;
FIG. 5 is an equivalent circuit for tapping a charge under an electrode;
FIG. 6 is a circuit diagram showing how a charge may be tapped;
FIG. 7 is a plan view of part of an alternative form of the invention; and
FIG. 8 is a voltage/time waveform of voltages applied to the device of FIG. 7.

FIG. 1 is a somewhat stylized plan view of a CCD and FIG. 2 is a cross section of FIG. 1 not drawn to scale. As shown in CCD has a silicon substrate 1 with an upper surface 2 on which a thin, typically 0.2 $\mu$m thick, layer 3 of oxide is grown by heating the substrate in an oxidizing atmosphere. On the oxide layer 3 is a row of finger like discrete electrodes comprising clocking electrodes 4, 5 and tapping electrodes 6, with a source gate 7 and a drain gate 8 near the ends of the surface 2. These electrodes 4, 5, 6 and gates 7, 8 may be formed by conventional photo etch techniques and may be of a metal such as aluminum or polycrystalline silicon. Typically the electrodes will be 10 $\mu$m thick, 300 $\mu$m wide with 2 $\mu$m separation.

Every third clocking electrode is connected together; the clocking electrode 4 nearest the source gate 7 is connected to a voltage source $\phi_1$ while the clocking electrode 5 nearest the drain gate 8 is connected to a voltage source $\phi_3$. The tapping electrodes 6 are each separately connected through a lead 9 to a d.c. voltage source $\phi_2$ and between each electrode 6 and load 9 is an output tap 10.

FIG. 3 shows the voltage wave forms $\phi_1$ and $\phi_3$ (pulses) and $\phi_2$ (a d.c. voltage) plotted against time.

FIG. 4 shows diagrammatically how depletion wells behave in the substrate. Application of a voltage to a clocking electrode 5 will cause a well in which the substrate under the electrode 5 is depleted of electrons (or holes). Electrons in the form of a charge packet from the source will readily move into such a well. Removing the voltage on an electrode causes a well to collapse and if an adjacent well is simultaneously created electrons will move into this new well. As shown at (a) in FIG. 4 a d.c. voltage $\phi_2$ of −10v is applied to tapping electrode 6 and a voltage pulse $\phi_3$ of −20v is applied to clocking electrode 5. These cause the wells 11, 12 in the substrate; the well 12 under the clocking electrode 5 sustaining a −20v input is deeper than the well 11 under the tapping electrode 6 sustaining a −10v input. When a voltage pulse $\phi_1$ is applied to clocking electrode 4 and the voltage pulse $\phi_3$ to electrode 5 is removed the charge packet of electrons moves into a new well 13 as shown in (b). Removing the voltage pulse $\phi_1$ causes the charge to enter the well 11 under the tapping electrode 6; as shown at (c) this reduces the depth of the depletion well 11 and charges its capacitance. This charge of capacitance is measured to indicate the quantity of the charge packet. Application of a voltage pulse $\phi_3$ of −20v to adjacent clocking electrode 5 causes the charge packet to enter the well 14 as shown at (d) after which the well 11 and tapping electrode 6 returns to its previous depth as at (a). The voltage $\phi_2$ is less than the voltage $\phi_3$; this is necessary to ensure emptying of charges in well 11 into well 14.

FIG. 5 shows an equivalent circuit for tapping the charge packet. The capacity of a depletion layer well 11 varies with the charge Q passing along the CCD while the capacitance of the tapping electrode 6 and the oxide layer 3 under this electrode 6 remains constant. Thus the signal voltage Vs at the tap 10 is a measure of the charge Q. When Cg >> A Cd and Cd << Cox it may be shown that Vs = QsA/Cg where Cg is the stray capacitance associated with the tapping circuitry
Cd is the depletion layer capacitance per unit area
Cox is the oxide capacitance per unit area Qs is the signal charge per unit area
Vs is the signal voltage 1 and
A is the electrode area.

While a charge packet is being sensed the voltage at the electrode 6 should remain substantially constant. This is achieved by making the time constant of the circuit large. A suitable circuit is shown at FIG. 6. The tapping electrode 6 is connected to a 12–15v d.c. supply through an MOS device $T_1$ which has its source 15 and gate 16 connected to the 12–15v supply and its drain 17 connected to the tapping electrode 6. The tapping electrode 6 is also connected to the gate 18 of an MOS device T2. The drain 19 of T2 is grounded and its source 20 is connected to the drain 21 of an MOS device T3 which has both its gate 22 and source 23 connected to the 12–15v supply. T1 and T3 may have identical characteristics. The amplified signal of Vs is observed at the junction 10 of the drain of T3 and source T2. The three devices T1, T2, T3 may be manufactured on the same substrate 1 as the CCD with the channel resistance of T1 forming the large resistance 9 (FIG. 1) to give the large time constant required.

The tapped output 10 may be weighted by varying the area of the electrodes 6.

In a modification the electrode 6 is split lengthwise into two half electrodes 6a, 6b as shown in FIG. 7. Such a configuration may have one half electrode 6a connected to a source of voltage pulses $\phi_2$ and the other half 6b connected to a pulse voltage source $\phi_2$. Waveforms for such pulsing are shown in FIG. 8, and it is noted that the voltage applied to the split electrodes 6a, 6b is higher relative to voltages $\phi_1$, $\phi_3$ than was the case for the electrode 6 shown in FIGS. 1, 2. This higher voltage is possible because the voltage applied to the tapping electrode is removed when a voltage $\phi_3$ is applied, thereby enabling a complete emptying of the well under the tapping electrode 6a, 6b into an identical well under the adjacent clocking electrode 5.

The description with reference to the drawings describe a three phase addressing of a CCD. The invention may also be used with two phase or more than three phase addressing; it may also be used in two layer electrode configurations. Basically a two layer CCD has a substrate with a thin oxide layer covering a flat surface and spaced electrodes on the oxide (as does the single layer CCD of the drawings). An additional oxide layer is grown on both electrodes and first oxide layer, and on this additional layer a second layer of electrodes are arranged parallel to the first layer of electrodes. The second layer of electrodes may overlap the first layer of electrodes and/or may be between the first layer of electrodes.

In a two level electrode CCD the tapping electrodes described with reference to the drawings may either be some of the first layer or the second layer of electrodes.

I claim:

1. A charge coupled device comprising a substrate, an insulating layer on a surface of the substrate, a row of electrodes spaced apart parallel to one another on the insulating layer and including a plurality of clocking electrodes and at least one tapping electrode, said tapping electrode being laterally spaced from said clocking electrodes and being disposed on the insulating layer between a pair of said clocking electrodes, a source gate at one end of the row of electrodes and a drain gate at the other end of the row of electrodes, first voltage means for applying short clocking voltage pulses to the clocking electrodes, second voltage means for applying different voltage pulses long in comparison with the clocking pulses to the tapping electrode whereby depletion wells may be formed in the substrate under the electrodes, and means coupled to said tapping electrode for nondestructively sensing the quantity of charge in a depletion well under said tapping electrode as a packet of charge is transferred from the source gate to the drain gate in the depletion wells.

2. A charge coupled device according to claim 1 wherein the second voltage means for applying said different voltage pulses comprise means for applying a steady voltage to said tapping electrode.

3. A charge coupled device according to claim 1 and comprising an additional insulating layer over the electrodes and an additional row of electrodes arranged parallel with the electrodes between the insulating layers.

4. A charge coupled device according to claim 1 wherein at least one tapping electrode is split longitudinally into two discrete electrodes one of which is connected to the said second voltage means for applying said different voltage pulses and the other of which is connected to the said first voltage means for applying said clocking pulses.

5. A charge coupled device according to claim 1 wherein the means for nondestructively sensing the charge includes field effect transistors.

6. A charge coupled device according to claim 5 wherein the field effect transistors are metal oxide semiconductors.

7. A charge coupled device according to claim 1 wherein the second voltage means for applying said different voltage pulses to the tapping electrode includes means for maintaining the voltage applied to said tapping electrode substantially constant during the time a quantity of charge at said tapping electrode is being nondestructively sensed.

* * * * *

UNITED STATES PATENT AND TRADEMARK OFFICE
CERTIFICATE OF CORRECTION

PATENT NO. : 3,950,655

DATED : April 13, 1976

INVENTOR(S) : Donald John McLennan et al

It is certified that error appears in the above-identified patent and that said Letters Patent are hereby corrected as shown below:

In the Heading, change the name of the assignee to:

-- The Secretary of State for Defence in Her Britannic Majesty's Government of the United Kingdom of Great Britain and Northern Ireland, London, England --

Signed and Sealed this

Nineteenth Day of October 1976

[SEAL]

Attest:

RUTH C. MASON
*Attesting Officer*

C. MARSHALL DANN
*Commissioner of Patents and Trademarks*